(12) United States Patent  
Tobita

(10) Patent No.: US 8,571,170 B2  
(45) Date of Patent: Oct. 29, 2013

(54) SHIFT REGISTER CIRCUIT

(71) Applicant: Youichi Tobita, Tokyo (JP)

(72) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/718,438

(22) Filed: Dec. 18, 2012

(65) Prior Publication Data

US 2013/0108006 A1     May 2, 2013

Related U.S. Application Data

(62) Division of application No. 13/020,475, filed on Feb. 3, 2011, now Pat. No. 8,379,790.

(30) Foreign Application Priority Data

May 10, 2010   (JP) ................................ 2010-107906

(51) Int. Cl.
    *G11C 19/00*      (2006.01)

(52) U.S. Cl.
    USPC ................... 377/64; 377/69; 377/79

(58) Field of Classification Search
None
See application file for complete search history.

(56) References Cited

U.S. PATENT DOCUMENTS

| | | | |
|---|---|---|---|
| 7,825,888 B2 | 11/2010 | Tobita et al. | |
| 7,873,140 B2 | 1/2011 | Moon et al. | |
| 8,018,423 B2 | 9/2011 | Tsai et al. | |
| 8,040,999 B2 | 10/2011 | Tobita | |
| 8,041,000 B2 | 10/2011 | Moon et al. | |
| 8,081,731 B2 | 12/2011 | Lin et al. | |
| 2006/0210012 A1 | 9/2006 | Yamaguchi et al. | |
| 2008/0055225 A1 | 3/2008 | Pak et al. | |
| 2009/0058790 A1 | 3/2009 | Chiang et al. | |
| 2009/0304138 A1* | 12/2009 | Tsai et al. | 377/79 |
| 2010/0182227 A1 | 7/2010 | Tsou | |
| 2011/0013740 A1 | 1/2011 | Lin et al. | |
| 2011/0069806 A1* | 3/2011 | Liao et al. | 377/64 |
| 2012/0105338 A1 | 5/2012 | Lin et al. | |

FOREIGN PATENT DOCUMENTS

| | | |
|---|---|---|
| JP | 2008-58939 | 3/2008 |
| JP | 2008-140490 | 6/2008 |
| JP | 2009-140608 | 6/2009 |
| JP | 2011-209714 | 10/2011 |

OTHER PUBLICATIONS

Office Action mailed Aug. 27, 2013 in Japanese Application No. 2010-107906 filed May 10, 2010 (w/partial English translation).

\* cited by examiner

*Primary Examiner* — Tuan T Lam  
(74) *Attorney, Agent, or Firm* — Oblon, Spivak, McClelland, Maier & Neustadt, L.L.P.

(57) ABSTRACT

An object is to enhance the driving capability and improve the operating speed of a unit shift register applicable to a scanning line driving circuit having a partial display function. A unit shift register forming a gate line driving circuit includes a first transistor that supplies a first clock signal to a first output terminal, a second transistor that supplies a second clock signal to a second output terminal, a third transistor that charges the gate of the first transistor in response to activation of a shift signal of the previous stage, and a fourth transistor connected between the gate of the first transistor and the gate of the second transistor. The first clock signal and the second clock signal have the same phase, and only the second clock signal is activated in a particular period (a display ineffective period).

4 Claims, 7 Drawing Sheets

F I G . 3
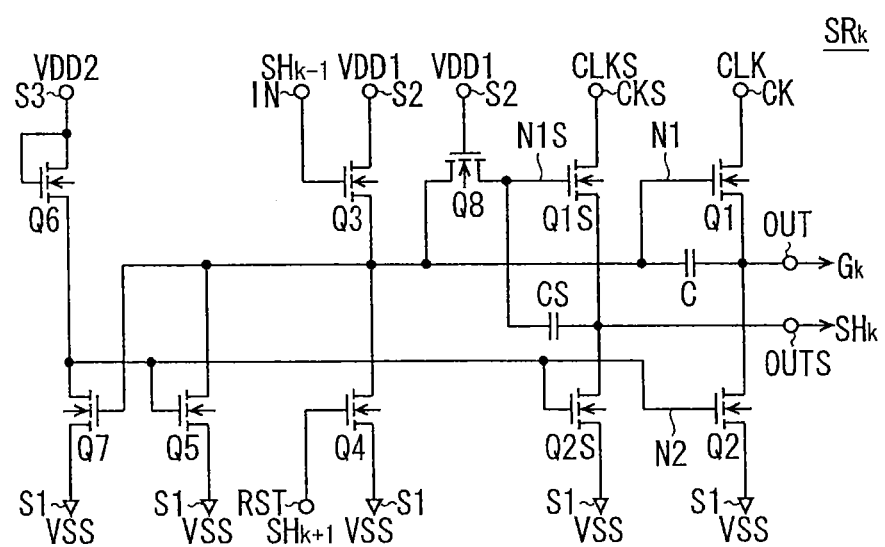

F I G . 5
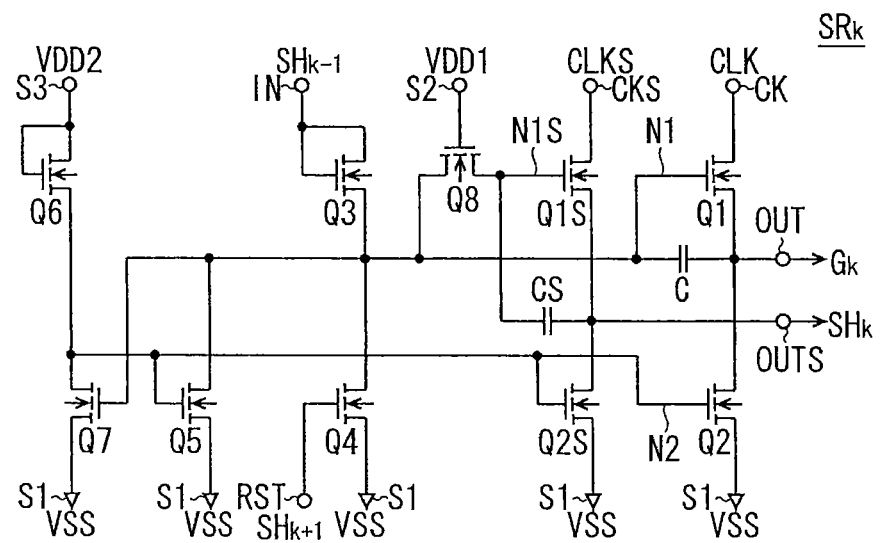
F I G . 6
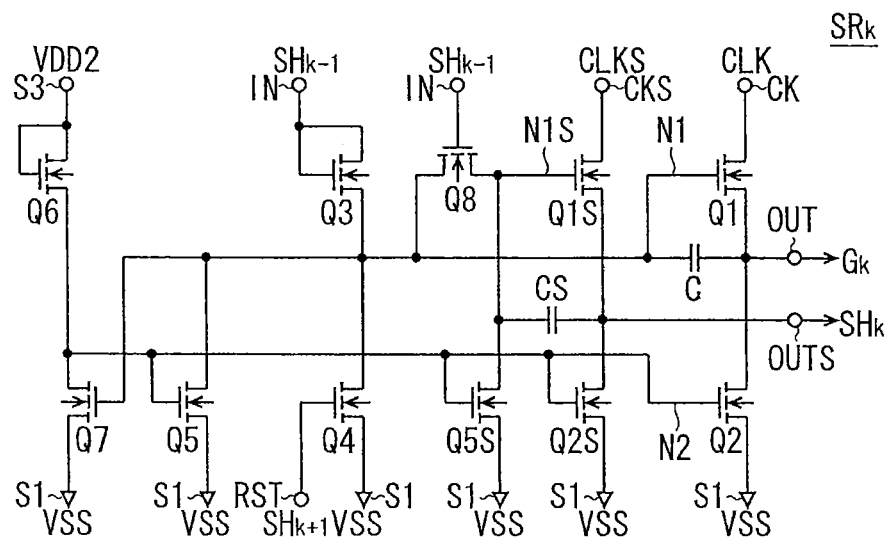

SHIFT REGISTER CIRCUIT

CROSS REFERENCE TO RELATED APPLICATION

The present divisional application claims the benefit of priority under 35 U.S.C. §120 to application Ser. No. 13/020,475, filed on Feb. 3, 2011, now U.S. Pat. No. 8,379,790, which claimed the benefit of priority under 35 U.S.C. §119 from Japanese Patent Application No. 2010-107906, filed on May 10, 2010. The entire contents of application Ser. No. 13/020,475 is incorporated herein by reference.

BACKGROUND OF THE INVENTION

1. Field of the Invention

The present invention relates to shift register circuits applicable to scanning line driving circuits, and particularly to a shift register circuit applicable to a scanning line driving circuit used in an image display apparatus having a partial display function and formed only of field-effect transistors of a same conductivity type.

2. Description of the Background Art

In an image display apparatus (hereinafter referred to as "a display apparatus") such as a liquid-crystal display apparatus, a gate line (scanning line) is provided for each pixel row (pixel line) on a display panel where a plurality of pixels are arranged in a matrix, and the gate lines are sequentially selected and driven in cycles of one horizontal period of a display signal to update the displayed image. For a gate line driving circuit (scanning line driving circuit) for sequentially selecting and driving the pixel lines or gate lines, a shift register that performs shift operation circulating in one frame period of the display signal can be used.

In the field of display apparatuses, techniques are known which reduce power consumption by making "partial display" by limiting the display to only a part of the screen. Specifically, the techniques disclosed in Japanese Patent Application Laid-Open Nos. 2008-140490 (hereinafter Patent Document 1) and 2008-58939 use shift registers formed only of field-effect transistors of the same conductivity type. When a shift register provided in a display apparatus is formed only of transistors of the same conductivity type, the number of process steps in the manufacturing process of the display apparatus can be reduced to reduce manufacturing costs.

A shift register as a gate line driving circuit is formed of a plurality of cascade-connected shift register circuits provided respectively for individual pixel lines or gate lines. In this specification, for the sake of convenience of description, each of the plurality of shift register circuits forming such a gate line driving circuit is referred to as "a unit shift register". That is to say, an output signal of each unit shift register of a gate line driving circuit is supplied to a gate line, and also inputted to a unit shift register in a next or following stage.

For example, Patent Document 1 discloses a scanning line driving circuit applicable to partial display, and FIG. 3 thereof shows the circuit configuration of a unit shift register (Ua) forming it. The unit shift register (Ua) outputs a scanning signal (Y) for driving a scanning line and a transfer signal (G) sent to the unit shift register in the next stage. In the unit shift register (Ua), a transfer signal generator (110A) for generating the transfer signal (G) always operates, while a scanning signal generator (120A) for generating the scanning signal (Y) is controlled to operate only in selected periods of pixel lines required to make display in partial display (display effective periods).

The scanning signal generator (120A) includes a first transistor (121) connected between a first clock terminal (P) and a scanning signal output terminal (y). The transfer signal generator (110A) includes a second transistor (111) connected between a second clock terminal (A) and a transfer signal output terminal (g). The gates of the first and second transistors (121, 111) are connected to each other, and they switch on and off with the same timing.

Now, a second clock signal (YCK1/YCK2) inputted to the second clock terminal (A) of each unit shift register (Ua) is activated always in given cycles, but a first clock signal (P1/P2) inputted to the first clock terminal (P) is activated in given cycles only in display effective periods, and it is maintained at an inactive level in the remaining periods (display ineffective periods). Thus, the scanning signal (Y) is activated only in display effective periods. As a result, only part of the pixel lines are activated, and partial display on the screen is achieved.

In the unit shift register (Ua) of FIG. 3 of Patent Document 1, a capacitance element (113) is connected between the source (transfer signal output terminal (g)) and the gate of the second transistor (111). This capacitance element (113) steps up the gate of the second transistor (111) when the transfer signal (G) is activated, and thus serves to enhance the driving capability (the capability of passing current) of the second transistor (111). When the gate of the second transistor (111) is sufficiently stepped up, the second transistor (111) operates in a non-saturation region, and the potential of the active level of the transfer signal (G) becomes higher.

As stated above, the gates of the first and second transistors (121, 111) are connected to each other, so that the driving capability of the first transistor (121) is also enhanced when the gate of the second transistor (111) is stepped up. Here, a node (α) to which the gates of the first and second transistors (121, 111) connect is referred to as "a gate node".

The first and second transistors (121, 111) each have gate capacitance (gate-source capacitance, gate-drain capacitance and gate-channel capacitance). In a display effective period, when the first and second transistors (121, 111) turn on, the transfer signal output terminal (g) and the scanning signal output terminal (y) are both charged in response to activation of the first clock signal (P1/P2) and second clock signal (YCK1/YCK2), and the gate capacitances of the first and second transistors (121, 111) both function to step up the gate node (α) together with the capacitance element (113).

However, in a display ineffective period, the second clock signal (YCK1/YCK2) is activated but the first clock signal (P1/P2) is not activated. Accordingly, when the first and second transistors (121, 111) turn on, only the transfer signal output terminal (g) is charged but the scanning signal output terminal (y) is not charged. In this case, the gate capacitance of the second transistor (111) functions to step up the gate node (α), but the gate capacitance of the first transistor (121) serves to hinder it. When the gate node (α) is insufficiently stepped up for this reason, the driving capability of the second transistor (111) of the unit shift register (Ua) is lowered in the display ineffective period. This hinders high-speed operation of the unit shift register (Ua), and lowers the operational margin of the scanning line driving circuit.

The first transistor (121) is required to have high driving capability to drive a gate line having large load capacitance, and its gate width is set wide. Accordingly, the gate capacitance of the first transistor (121) has a large value (the gate capacitance is proportional to the product of the gate width and gate length), and this problem is likely to occur.

SUMMARY OF THE INVENTION

An object of the present invention is to enhance the driving capability and improve the operating speed of a unit shift register that is applicable to a scanning line driving circuit having a partial display function.

A shift register circuit according to a first aspect of the present invention includes: an input terminal, first and second output terminals, and first and second clock terminals; and first to fourth transistors below. The first transistor supplies the first output terminal with a first clock signal inputted to the first clock terminal. The second transistor supplies the second output terminal with a second clock signal inputted to the second clock terminal. The third transistor charges a first node to which a control electrode of the first transistor connects or a second node to which a control electrode of the second transistor connects, in response to activation of an input signal inputted to the input terminal. The fourth transistor is connected between the first node and the second node. The first clock signal and the second clock signal have a same phase, and a setting can be made such that only the second clock signal is activated in a particular period.

A shift register circuit according to a second aspect of the present invention includes: an input terminal, first and second output terminals, and first and second clock terminals; and first to fourth transistors below. The first transistor supplies the first output terminal with a first clock signal inputted to the first clock terminal. The second transistor supplies the second output terminal with a second clock signal inputted to the second clock terminal. The third transistor charges a first node to which a control electrode of the first transistor connects, in response to activation of an input signal inputted to the input terminal. The fourth transistor charges a second node to which a control electrode of the second transistor connects, in response to activation of the input signal. The first clock signal and the second clock signal have a same phase, and a setting can be made such that only the second clock signal is activated in a particular period.

A shift register circuit according to a third aspect of the present invention includes: first and second input terminals, first and second output terminals, and first and second clock terminals; first and second voltage signal terminals respectively supplied with first and second voltage signals that are complementary to each other; and first to fifth transistors below. The first transistor supplies the first output terminal with a first clock signal inputted to the first clock terminal. The second transistor supplies the second output terminal with a second clock signal inputted to the second clock terminal. The third transistor supplies the first voltage signal to a first node to which a control electrode of the first transistor connects or a second node to which a control electrode of the second transistor connects, in response to activation of a first input signal inputted to the first input terminal. The fourth transistor supplies the second voltage signal to the first node or the second node in response to activation of a second input signal inputted to the second input terminal. The fifth transistor is connected between the first node and the second node. The first clock signal and the second clock signal have a same phase, and a setting can be made such that only the second clock signal is activated in a particular period.

A shift register circuit according to a fourth aspect of the present invention includes: first and second input terminals, first and second output terminals, and first and second clock terminals; first and second voltage signal terminals respectively supplied with first and second voltage signals that are complementary to each other; and first to sixth transistors below. The first transistor supplies the first output terminal with a first clock signal inputted to the first clock terminal. The second transistor supplies the second output terminal with a second clock signal inputted to the second clock terminal. The third transistor supplies the first voltage signal to a first node to which a control electrode of the first transistor connects, in response to activation of a first input signal inputted to the first input terminal. The fourth transistor supplies the second voltage signal to the first node in response to activation of a second input signal inputted to the second input terminal. The fifth transistor supplies the first voltage signal to a second node to which a control electrode of the second transistor connects, in response to activation of the first input signal. The sixth transistor supplies the second voltage signal to the second node in response to activation of the second input signal. The first clock signal and the second clock signal have a same phase, and a setting can be made such that only the second clock signal is activated in a particular period.

According to the present invention, when the second output signal (shift signal) is activated, the control electrode of the second transistor that charges the second output terminal and the control electrode of the second transistor that charges the first output terminal of the first output signal (gate line driving signal) are electrically separated. Accordingly, the driving capability of the second transistor can be kept high irrespective of whether or not it is a period in which the first output signal is activated (a display effective period).

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram illustrating a unit shift register of the preferred embodiment;

FIG. 5 is a circuit diagram of a unit shift register according to a first modification of the preferred embodiment;

FIG. 6 is a circuit diagram of a unit shift register according to a second modification of the preferred embodiment;

DESCRIPTION OF THE PREFERRED EMBODIMENTS

Figure 1:
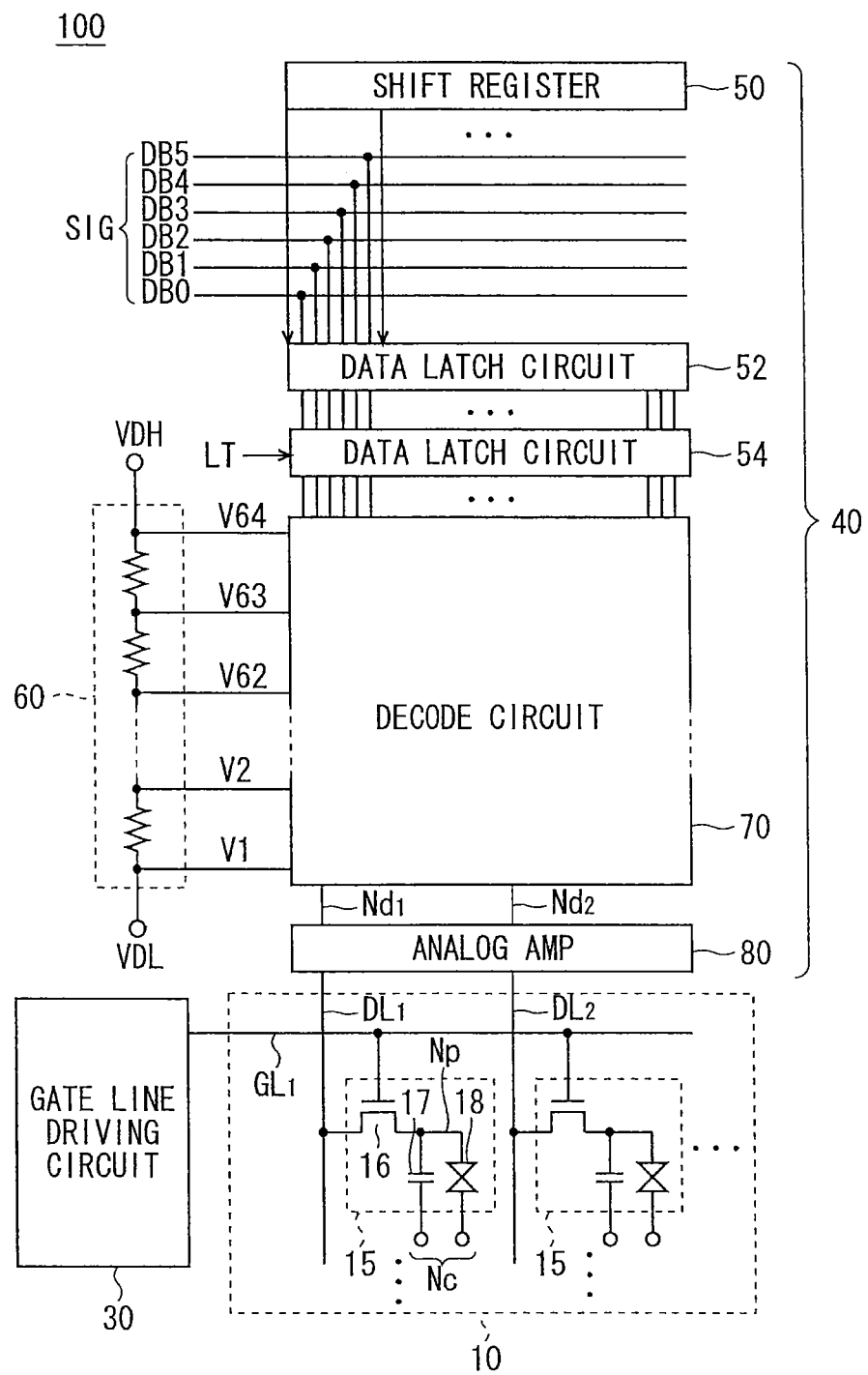
FIG. 1 is a schematic block diagram illustrating the configuration of a liquid-crystal display apparatus.

Now, the preferred embodiments of the present invention will be described referring to the drawings. In order to avoid redundant repetitions of description, elements having the same or corresponding functions are shown with the same reference characters in the drawings.

The transistors used in the preferred embodiments are insulated-gate field-effect transistors. In an insulated-gate field-effect transistor, the electric conductivity between the drain region and source region in the semiconductor layer is controlled by the electric field in the gate insulating film. The material of the semiconductor layer in which the drain region and source region are formed can be polysilicon, amorphous silicon, organic semiconductor like pentacene, single crystal silicon, or oxide semiconductor like IGZO (In—Ga—Zn—O), for example.

As is well known, a transistor is an element that has at least three electrodes including a control electrode (a gate (electrode) in a narrow sense), one current electrode (a drain (electrode) or a source (electrode) in a narrow sense), and the other current electrode (a source (electrode) or a drain (electrode) in a narrow sense). A transistor functions as a switching element in which a channel is formed between the drain and source when a given voltage is applied to the gate. The drain and the source of a transistor are structured basically the same, and their names are changed according to the applied voltage condition. For example, with an N-type transistor, an electrode of a relatively higher potential (hereinafter also referred to as "level") is referred to as a drain, and an electrode with a lower potential is referred to as a source (a P-type transistor has the opposite relation).

Unless specifically noted, such transistors may be ones formed on a semiconductor substrate, or may be thin-film transistors (TFTs) formed on an insulating substrate such as glass. Substrates on which transistors are formed may also be single crystal substrates, or insulating substrates such as SOI, glass, resin, etc.

The gate line driving circuit of the present invention is formed by using transistors of a single conductivity type. For example, an N-type transistor goes into an active state (on state, conducting state) when the gate-source voltage goes to H (High) level higher than the threshold voltage of that transistor, and goes into an inactive state (off state, non-conducting state) at L (Low) level lower than the threshold voltage. Accordingly, in a circuit using N-type transistors, H level of a signal is an "active level", and L level is an "inactive level". Also, a node in a circuit using N-type transistors is charged to H level and a change from an inactive level to active level occurs, and it is discharged to L level and a change from an active level to inactive level occurs.

On the other hand, a P-type transistor goes into an active state (on state, conducting state) when the gate-source voltage goes to L level lower than the threshold voltage of the transistor (a negative value based on the source), and goes into an inactive state (off state, non-conducting state) at H level higher than the threshold voltage. Accordingly, in a circuit using P-type transistors, L level of a signal is an "active level", and H level is an "inactive level". Also, the charging and discharging relations of nodes in a circuit using P-type transistors are opposite to those of N-type transistors, and they are charged to L level and a change from an inactive level to active level occurs, and discharged to H level and a change from an active level to inactive level occurs.

In this specification, a change from an inactive level to an active level is defined as "pull up", and a change from an active level to an inactive level is defined as "pull down". That is, in a circuit using N-type transistors, a change from L level to H level is defined as "pull up", and a change from H level to L level is defined as "pull down", and in a circuit using P-type transistors, a change from H level to L level is defined as "pull up", and a change from L level to H level is defined as "pull down".

Also, in this specification, "connect" between two elements, two nodes, or one element and one node includes connections that are made through another component (an element, switch, etc.) but that are substantially equivalent to direct connection. For example, even when two elements are connected through a switch, the two elements are represented as "connected" when they can function in the same way as when they are directly connected.

In the present invention, clock signals having different phases (multi-phase clock signals) are used. In the description below, for the sake of simplicity, a certain interval is set between an active period of one clock signal and the active period of the next activated clock signal ($\Delta t$ in FIG. 4). However, in the present invention, what is essential is that the active periods of clock signals do not substantially overlap, and the above-mentioned intervals may be omitted. For example, when the active level is H level, the timing of a fall of one clock signal (a change from H level to L level) and the timing of a rise of the next activated clock signal (a change from L level to H level) may be the same timing.

Preferred Embodiment

FIG. 1 is a schematic block diagram illustrating the configuration of a display apparatus according to the present invention, and it shows the overall configuration of a liquid-crystal display apparatus as a typical example of a display apparatus. The present invention is not limited to applications to liquid-crystal display apparatuses, but can be widely applied to electro-optic apparatuses, such as electroluminescence (EL), organic EL, plasma displays, electronic paper, etc., as display apparatuses that convert electric signals to light luminance.

The liquid-crystal display apparatus 100 includes a liquid-crystal array portion 10, a gate line driving circuit (scanning line driving circuit) 30, and a source driver 40. As will become clear from the description below, the shift register of this preferred embodiment is provided in the gate line driving circuit 30.

The liquid-crystal array portion 10 includes a plurality of pixels 15 arranged in a matrix. Gate lines $GL_1$, $GL_2$, . . . (collectively referred to as "gate lines GL") are provided respectively for the rows of pixels (hereinafter also referred to as "pixel lines"), and data lines $DL_1$, $DL_2$, . . . (collectively referred to as "data lines DL") are provided respectively for the columns of pixels (hereinafter also referred to as "pixel columns"). As examples thereof, FIG. 1 shows pixels 15 on the first column and the second column on the first row, and the corresponding gate line $GL_1$ and data lines $DL_1$ and $DL_2$.

Each pixel 15 includes a pixel switch element 16 provided between the corresponding data line DL and a pixel node Np, and a capacitor 17 and a liquid-crystal display element 18 connected in parallel between the pixel node Np and common electrode node Nc. The alignment of the liquid crystal in the liquid-crystal display element 18 changes according to the voltage difference between the pixel node Np and common electrode node Nc, and the display luminance of the liquid-crystal display element 18 changes in response. Thus, it is possible to control the luminance of each pixel according to the display voltage transmitted to the pixel node Np through the data line DL and pixel switch element 16. That is, intermediate luminance can be obtained as an intermediate voltage difference between the voltage difference corresponding to the maximum luminance and the voltage difference corresponding to the minimum luminance is applied between the pixel node Np and the common electrode node Nc. Thus, levels of luminance can be obtained by setting the display voltage at levels.

On the basis of a given scanning cycle, the gate line driving circuit 30 sequentially selects and activates the gate lines GL. The gate electrodes of the pixel switch elements 16 are connected respectively to the corresponding gate lines GL. While a particular gate line GL is being selected, the pixel switch elements 16 of the pixels connected thereto are conductive and the pixel nodes Np are connected to the corresponding data lines DL. Then, the display voltage transmitted to the pixel node Np is held in the capacitor 17. Generally, the pixel switch elements 16 are formed of TFTs formed on the same insulating substrate (glass substrate, resin substrate, etc.) with the liquid-crystal display elements 18.

To the data lines DL, the source driver 40 outputs display voltage that is set at levels by the display signal SIG as an N-bit digital signal. Herein, as an example, the display signal SIG is a 6-bit signal and formed of display signal bits DB0 to DB5. On the basis of the 6-bit display signal SIG, for each pixel, $2^6$=64 levels of gray scale display are possible. Furthermore, when one color display unit is formed of three pixels of R (Red), G (Green) and B (Blue), color display of about 260,000 colors is possible.

As shown in FIG. 1, the source driver 40 includes a shift register 50, data latch circuits 52, 54, a gray scale voltage generating circuit 60, a decode circuit 70, and an analog amp 80.

In the display signal SIG, the display signal bits DB0 to DB5 corresponding to the display luminance of each pixel 15 are serially generated. That is, the display signal bits DB0 to DB5 at each timing indicate the display luminance in one pixel 15 in the liquid-crystal array portion 10.

The shift register 50 instructs the data latch circuit 52 to capture the display signal bits DB0 to DB5 with a timing synchronized with the cycle of switching of the setting of the display signal SIG. The data latch circuit 52 sequentially captures the serially generated display signal SIG and holds a display signal SIG for one pixel line.

The latch signal LT inputted to the data latch circuit 54 is activated with the timing by which the display signal SIG for one pixel line is captured into the data latch circuit 52. In response, the data latch circuit 54 captures the display signal SIG for one pixel line that is held in the data latch circuit 52 at that time.

The gray scale voltage generating circuit 60 is formed of 63 voltage-dividing resistors connected in series between high voltage VDH and low voltage VDL and generates 64 levels of gray scale voltages V1 to V64.

The decode circuit 70 decodes the display signal SIG held in the data latch circuit 54. On the basis of the results of decoding, the decode circuit 70 selects voltages from among the gray scale voltages V1 to V64, and outputs them to the decode output nodes $Nd_1$, $Nd_2$, ... (collectively referred to as "decode output nodes Nd").

As a result, display voltages (one of the gray scale voltages V1 to V64) corresponding to the display signal SIG for one pixel line held in the data latch circuit 54 are simultaneously (in parallel) outputted to the decode output nodes Nd. FIG. 1 shows the decode output nodes $Nd_1$ and $Nd_2$ corresponding to the first and second data lines $DL_1$ and $DL_2$ as examples.

The analog amp 80 amplifies the analog voltages corresponding to the display voltages outputted from the decode circuit 70 to the decode output nodes $Nd_1$, $Nd_2$, ... and outputs them to the data lines $DL_1$, $DL_2$, ...

On the basis of a given scanning cycle, the source driver 40 repeatedly outputs display voltages corresponding to the series of display signals SIG to the data lines DL, one pixel line at a time, and the gate line driving circuit 30 sequentially drives the gate lines $GL_1$, $GL_2$, ... in synchronization with the scanning cycle, whereby the liquid-crystal array portion 10 displays images based on the display signal SIG.

FIG. 1 shows the configuration of a liquid-crystal display apparatus 100 in which the gate line driving circuit 30 and the source driver 40 are integrated with the liquid-crystal array portion 10. However, the gate line driving circuit 30 and the liquid-crystal array portion 10 may be integrated together and the source driver 40 may be provided as an external circuit of the liquid-crystal array portion 10, or, the gate line driving circuit 30 and the source driver 40 may be provided as external circuitry of the liquid-crystal array portion 10.

Figure 2:
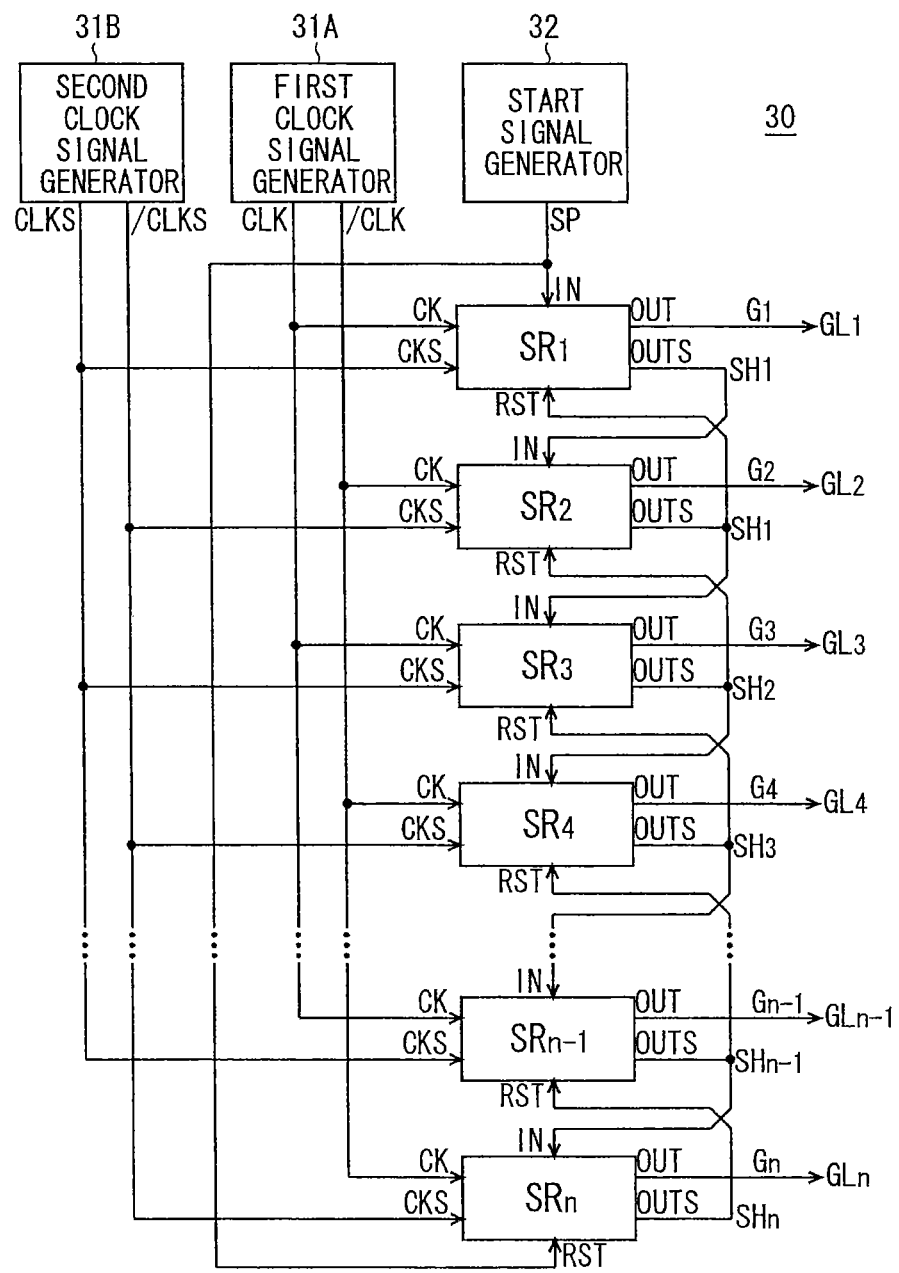
FIG. 2 is a diagram illustrating the configuration of a gate line driving circuit according to a preferred embodiment of the present invention.

FIG. 2 is a diagram illustrating the configuration of the gate line driving circuit 30. This gate line driving circuit 30 is formed of a shift register composed of a plurality of cascade-connected unit shift registers $SR_1$, $SR_2$, $SR_3$, $SR_4$, ..., $SR_n$ (for the sake of convenience of description, the cascade-connected unit shift registers $SR_1$, $SR_2$, ... are collectively referred to as "unit shift registers SR"). Each unit shift register SR is provided for one pixel line, or one gate line GL.

Each unit shift register SR has an input terminal IN, a first output terminal OUT, a second output terminal OUTS, a reset terminal RST, a first clock terminal CK, and a second clock terminal CKS. The first output terminal OUT is connected to the corresponding gate line GL.

The first output terminal OUT of each unit shift register SR outputs a gate line driving signal G (a first output signal) for driving the corresponding gate line GL. The gate line driving signal G functions as a so-called vertical (or horizontal) scanning pulse.

The second output terminal OUTS of each unit shift register SR outputs a shift signal SH (a second output signal) defining the shift operation of signals of the gate line driving circuit 30. The input terminal IN of each unit shift register SR is supplied with, as an input signal, the shift signal SH outputted from the unit shift register SR in the previous stage. However, the input terminal IN of the unit shift register $SR_1$ in the first stage is supplied with, as an input signal, a start pulse SP corresponding to the beginning of each frame period of the image signal.

The shift signal SH of each unit shift register SR is supplied also to the reset terminal RST of the unit shift register SR in the previous stage. That is to say, the reset terminal RST of each unit shift register SR is supplied, as a reset signal, with the shift signal outputted from the unit shift register SR in the next stage. However, the reset terminal RST of the unit shift register $SR_n$ in the final stage (the nth stage) is supplied, as a reset signal, with the above-mentioned start pulse SP.

The first clock terminal CK of each unit shift register SR is supplied with a clock signal CLK or /CLK generated by a first clock signal generator 31A. In the example of FIG. 2, the clock signal CLK is supplied to the first clock terminals CK of the odd-numbered unit shift registers $SR_1$, $SR_3$, $SR_5$, ..., and the clock signal /CLK is supplied to the first clock terminals CK of the even-numbered unit shift registers $SR_2$, $SR_4$, $SR_6$, ...

The second clock terminal CKS of each unit shift register SR is supplied with a clock signal CLKS or /CLKS generated by a second clock signal generator 31B. In the example of FIG. 2, the clock signal CLKS is supplied to the second clock terminals CKS of the odd-numbered unit shift registers $SR_1$, $SR_3$, $SR_5$, ..., and the clock signal /CLKS is supplied to the second clock terminals CKS of the even-numbered unit shift registers $SR_2$, $SR_4$, $SR_6$, ...

Hereinafter, for the sake of convenience of description, the clock signals CLK, /CLK generated by the first clock signal generator 31A are referred to as "first clock signals", and the second clock signals CLKS, /CLKS generated by the second clock signal generator 31B are referred to as "second clock signals".

The first clock signals CLK and /CLK are two-phase clock signals having different phases (the active periods do not overlap). The first clock signals CLK and /CLK have opposite phases, and are controlled to be alternately activated with a timing synchronized with the scanning cycles of the display apparatus.

The second clock signals CLKS, /CLKS are also two-phase clock signals having different phases (the active periods do not overlap), and, like the first clock signals CLK and /CLK, they are also controlled to be alternately activated with a timing synchronized with the scanning cycles of the display apparatus. The first clock signal CLK and the second clock signal CLKS have the same phase, and the first clock signal /CLK and the second clock signal /CLKS have the same phase.

In each unit shift register SR of this preferred embodiment, the first clock signals CLK, /CLK are used as signals for activating the gate line driving signal G, and the second clock signals CLKS, /CLKS are used as signals for activating the shift signal SH.

The second clock signals CLKS, /CLKS are always activated in given cycles (corresponding to 2 horizontal scanning periods) in each frame, but the first clock signals CLK, /CLK are activated only in selected periods of pixel lines requiring display (display effective periods). That is to say, when a partial display is made, the first clock signals CLK, /CLK are activated only in a display effective period, and they are kept at an inactive level in the remaining periods (display ineffective periods). Accordingly, the first clock signals CLK, /CLK are signals having waveforms corresponding to part of the waveforms of the second clock signals CLKS, /CLKS. When a normal display is made in the entire screen, the first clock signals CLK, /CLK are activated always with given cycles like the second clock signals CLKS, /CLKS.

As will be fully described later, in synchronization with the second clock signals CLKS, /CLKS, each unit shift register SR of the gate line driving circuit 30 operates to transfer the signal inputted to the input terminal IN (the start pulse SP or the shift signal SH of the previous stage) to the unit shift register SR in the next stage, while shifting the signals in time. As a result, the shift signals SH of the individual unit shift registers SR are sequentially activated, as $SH_1$, $SH_2$, $SH_3$, . . .

Also, when activating the shift signal SH, each unit shift register SR also activates the gate line driving signal G in response to activation of the first clock signals CLK, /CLK. Since the first clock signal CLK and the second clock signal CLKS have the same phase and the first clock signal /CLK and the second clock signal /CLKS also have the same phase, the gate line driving signals $G_1$, $G_2$, $G_3$, . . . are activated respectively with the same timing as the shift signals $SH_1$, $SH_2$, $SH_3$, . . . As a result, the gate lines $GL_1$, $GL_2$, $GL_3$, . . . are sequentially activated. However, the first clock signals CLK, /CLK are activated only in display effective periods. Accordingly, when a partial display is made, only the gate lines GL corresponding to the display effective period are activated.

FIG. 3 is a circuit diagram illustrating the configuration of a unit shift register SR of the present invention. In the gate line driving circuit 30, the plurality of cascade-connected unit shift registers SR are all configured substantially the same, so that the configuration of a kth unit shift register $SR_k$ will be illustrated as an example. In this preferred embodiment, the transistors forming the unit shift registers SR are all field-effect transistors of the same conductivity type, and an example using N-type TFTs will be described herein.

As shown in FIG. 3, the unit shift register $SR_k$ has the input terminal IN, the first output terminal OUT, the second output terminal OUTS, the first clock terminal CK, the second clock terminal CKS, and the reset terminal RST shown in FIG. 2, and it further has a first power-supply terminal Si supplied with a low-side power-supply potential VSS, and second and third power-supply terminals S2 and S3 respectively supplied with high-side power-supply potentials VDD1 and VDD2. The high-side power-supply potentials VDD1 and VDD2 may be at the same level.

In the description below, the low-side power-supply potential VSS is the reference potential of the circuit (VSS=0). However, in practical use, a reference potential is set on the basis of the voltage of data written to the pixels, and the high-side power-supply potentials VDD1 and VDD2 are set at 17 V, for example, and the low-side power-supply potential VSS is set at −12 V, for example.

In the unit shift register $SR_k$, the output stage of the gate line driving signal $G_k$ includes a transistor Q1 that brings the gate line driving signal $G_k$ to an active level (H level) when it is a selected period of the gate line $GL_k$ and also a display effective period, and a transistor Q2 for keeping the gate line driving signal $G_k$ at an inactive level (L level) in the non-selected periods of the gate line $GL_k$.

The transistor Q1 is connected between the first output terminal OUT and the first clock terminal CK, and it activates the gate line driving signal $G_k$ by supplying the first output terminal OUT with the first clock signal (CLK or /CLK) inputted to the first clock terminal CK. The transistor Q2 is connected between the first output terminal OUT and the first power-supply terminal S1, and it keeps the gate line driving signal $G_k$ at an inactive level by discharging the first output terminal OUT to the potential VSS. The node to which the gate (control electrode) of the transistor Q1 connects is defined as "a node N1", and the node to which the gate of the transistor Q2 connects is defined as "a node N2".

A capacitance element C (step-up capacitance) is provided between the gate and source of the transistor Q1 (i.e. between the first output terminal OUT and the node N1). The capacitance element C capacitive-couples the first output terminal OUT and the node N1, in order to enhance the step-up effect of the node N1 as the level of the first output terminal OUT rises. However, when the gate-channel capacitance of the transistor Q1 is sufficiently large, the capacitance element C can be replaced by it, and can be omitted in this case.

The output stage of the shift signal $SH_k$ includes a transistor Q1S that brings the shift signal $SH_k$ to an active level (H level) in the selected period of the gate line $GL_k$, and a transistor Q2S for keeping the shift signal $SH_k$ at an inactive level (L level) in the non-selected periods of the gate line $GL_k$.

The transistor Q1S is connected between the second output terminal OUTS and the second clock terminal CKS, and it activates the shift signal $SH_k$ by supplying the second output terminal OUTS with the second clock signal (CLKS or /CLKS) inputted to the second clock terminal CKS. The transistor Q2S is connected between the second output terminal OUTS and the first power-supply terminal S1, and it keeps the shift signal $SH_k$ at an inactive level by discharging the second output terminal OUTS to the potential VSS. The gate of the transistor Q2S is connected to the node N2. The node to which the gate of the transistor Q1S connects is defined as "a node N1S".

In the unit shift register $SR_k$ of this preferred embodiment, a transistor Q8 having its gate connected to the second power-supply terminal S2 is connected between the node N1 and the node N1S.

A capacitance element CS (step-up capacitance) is provided between the gate and source of the transistor Q1S (i.e. between the second output terminal OUTS and the node N1S). The capacitance element CS capacitive-couples the second output terminal OUTS and the node N1S, in order to enhance the step-up effect of the node N1S as the level of the second output terminal OUTS rises. However, when the gate-channel capacitance of the transistor Q1S is sufficiently large, the capacitance element CS can be replaced by it, and can be omitted in this case.

A transistor Q3 is connected between the node N1 and the second power-supply terminal S2, and its gate is connected to the input terminal IN. The transistor Q3 functions to charge the node N1 in response to activation of the signal supplied to the input terminal IN (input signal). The drain of the transistor Q3 may be connected to the third power-supply terminal S3.

A transistor Q4, having its gate connected to the reset terminal RST, is connected between the node N1 and the first power-supply terminal S1. The transistor Q4 functions to discharge the node N1 in response to activation of the signal supplied to the reset terminal RST (reset signal). Also, a transistor Q5, having its gate connected to the node N2, is connected between the node N1 and the first power-supply terminal S1. The transistor Q5 functions to keep the node N1 at an inactive level (L level) by discharging the node N1 while the node N2 is at an active level (H level).

The circuit formed of the transistors Q3, Q4 and Q5 forms "a pull-up driving circuit" that drives the transistors Q1 and Q1S (output pull-up transistors) by charging/discharging the node N1.

Also, a transistor Q6, having its gate connected to the third power-supply terminal S3, is connected between the node N2 and the third power-supply terminal S3 (i.e. the transistor Q6 is diode-connected). A transistor Q7, having its gate connected to the node Ni, is connected between the node N2 and the first power-supply terminal S1.

The on-state resistance of the transistor Q7 is set sufficiently smaller than that of the transistor Q6 (i.e. its driving capability is set larger). Accordingly, when the gate of the transistor Q7 (the node N1) goes to H level and the transistor Q7 turns on, the node N2 is discharged to L level. On the other hand, when the node N1 goes to L level and the transistor Q7 turns off, the node N2 is charged by the transistor Q6 to H level.

That is to say, the transistors Q6 and Q7 form a ratio-type inverter having the node N1 as an input end and the node N2 as an output end. In this inverter, the transistor Q6 functions as a load element and the transistor Q7 functions as a driving element. This inverter forms "a pull-down driving circuit" that drives the transistors Q2 and Q2S (output pull-down transistors) by charging/discharging the node N2.

The operation of the unit shift register $SR_k$ of FIG. 3 will be described. For the sake of simplicity of description, in the unit shift register $SR_k$, it is assumed that the first clock signal CLK is inputted to the first clock terminal CK and the second clock signal CLKS is inputted to the second clock terminal CKS (for example, in FIG. 2, the unit shift registers $SR_1$, $SR_3$, etc correspond to this).

Also, the low-side power-supply potential VSS supplied to the first power-supply terminal S1 is assumed to be the reference potential (0 [V]). Also, it is assumed that the L level potentials of the first clock signals CLK, /CLK, second clock signals CLKS, /CLKS and the start pulse SP are all VSS (0 [V]). Also, the high-side power-supply potential VDD1 supplied to the second power-supply terminal S2 and the high-side power-supply potential VDD2 supplied to the third power-supply terminal S3 are assumed to be equal to each other, and its value is taken as VDD.

Also, the H level potentials of the first clock signals CLK, /CLK, second clock signals CLKS, /CLKS and the start pulse SP are assumed to be all equal, and its value is also taken as VDD. Also, the threshold voltages of the transistors are assumed to be all equal, and its value is taken as Vth.

The operation of the unit shift register $SR_k$ in a display effective period will be described here. In a display effective period, the first clock signals CLK and /CLK are activated like the second clock signals CLKS and /CLKS.

As an initial state of the unit shift register $SR_k$, a state where the node N1 is at L level (VSS) and the node N2 is at H level (VDD-Vth) is assumed (hereinafter this state is referred to as "a reset state"). At this time, the transistor Q1 is off and the transistor Q2 is on, and the first output terminal OUT (gate line driving signal $G_k$) is at L level (VSS). Also, the transistor Q8 is on, and the node N1S is at L level (VSS) as well as the node N1. Accordingly, the transistor Q1S is off and the transistor Q2S is on, and the second output terminal OUTS (shift signal $SH_k$) is also at L level (VSS).

From this state, when the shift signal $SH_{k-1}$ of the previous stage goes to H level (VDD), the transistor Q3 in the unit shift register $SR_k$ turns on. At this time, the node N2 is at H level and the transistor Q5 is also on, but since the on-state resistance of the transistor Q3 is set sufficiently smaller than that of the transistor Q5 (the driving capability is set sufficiently larger), and the potential of the node N1 rises.

Then, the transistor Q7 starts conducting and the level of the node N2 decreases. Then, the resistance value of the transistor Q5 rises and the level of the node N1 rapidly rises, and the transistor Q7 sufficiently turns on. As a result, the node N2 goes to L level (approximately equal to VSS). In response, the transistor Q5 turns off, and the node N1 goes to H level (VDD-Vth). When thus the node N1 is at H level and the node N2 is at L level (hereinafter this state is referred to as "a set state"), the transistor Q1 is on and the transistor Q2 is off.

Since the node N2 went to L level, the transistor Q2S turns off. Also, since the node N1 went to H level, the node N1S is charged through the transistor Q8 in an on state and goes to H level (VDD-Vth). Accordingly, the transistor Q1S turns on.

When the shift signal $SH_{k-1}$ of the previous stage returns to L level, the transistor Q3 turns off, and the transistors Q4 and Q5 are also off, and the nodes N1 and N1S are kept at H level with high impedance state (floating state).

Since it is in a display effective period, the first clock signal CLK is next activated. When the first clock signal CLK goes to H level (VDD), the first output terminal OUT is charged through the transistor Q1 in an on state, and the level of the gate line driving signal $G_k$ rises. At this time, the potential of the node N1 is stepped up due to the coupling through the capacitance element C and the gate capacitance of the transistor Q1 (gate-drain capacitance, gate-source capacitance and gate-channel capacitance). Accordingly, even when the level of the first output terminal OUT rises, the gate-source voltage of the transistor Q1 is kept larger than the threshold voltage (Vth), and the transistor Q1 is kept at low impedance.

Accordingly, the gate line driving signal $G_k$ quickly goes to H level following the rise of the first clock signal CLK. Also, since the transistor Q1 operates in a non-saturation region, the level of the gate line driving signal $G_k$ rises to the same potential VDD as the clock signal CLK. As a result, the gate line $GL_k$ enters a selected state.

At the same time as the first clock signal CLK goes to H level, the second clock signal CLKS also goes to H level (VDD). Then, the second output terminal OUTS is charged through the transistor Q1S in an on state, and the level of the shift signal $SH_k$ rises. At this time, the potential of the node N1S is stepped up due to the coupling through the capacitance element CS and the gate capacitance of the transistor Q1S (gate-drain capacitance, gate-source capacitance, and gate-channel capacitance).

Accordingly, even when the level of the second output terminal OUTS rises, the gate-source voltage of the transistor Q1S is kept larger than the threshold voltage (Vth), and the transistor Q1S is kept at low impedance.

Accordingly, the shift signal $SH_k$ quickly goes to H level following the rise of the second clock signal CLKS. Also, at this time, the transistor Q1S operates in a non-saturation region and charges the second output terminal OUTS, so that the level of the shift signal $SH_k$ rises to the same potential VDD as the second clock signal CLKS.

Since the step-up of the node N1 and the step-up of the node N1S take place at the same time, the gate of the transistor Q8 becomes higher than the two current electrodes (source, drain). Accordingly, when the nodes N1 and N1S are stepped up, the transistor Q8 turns off, and the nodes N1 and N1S are electrically separated. Since the node N1S is connected to a small number of transistors, the parasitic capacitance becomes very small when separated from the node N1. Accordingly, the node N1S is sufficiently stepped up and the rising rate of the shift signal $SH_k$ is sufficiently high.

After that, the first clock signal CLK and the second clock signal CLK goes to L level (VSS) together. Then, the first and second output terminals OUT and OUTS are discharged through the transistors Q1 and Q1S in an on state, and the gate line driving signal $G_k$ and the shift signal $SH_k$ go to L level (VSS). As a result, the gate line $GL_k$ returns to a non-selected state.

When the shift signal $SH_k$ was activated, the next stage (unit shift register $SR_{k+1}$) is in a set state, and the shift signal $SH_{k+1}$ of the next stage goes to H level when the second clock signal /CLK is activated next.

Then, in this unit shift register $SR_k$, the transistor Q4 turns on, and the nodes N1 and N1S are discharged to L level (VSS). In response, the transistor Q7 turns off, and the node N2 is charged by the transistor Q6 to go to H level (VDD-Vth). As a result, the unit shift register $SR_k$ returns to the reset state, and the transistors Q1 and Q1S are off and the transistors Q2 and Q2S are on.

After that, the unit shift register $SR_k$ is kept in the reset state until the shift signal $SH_{k-1}$ of the previous stage is activated in the next frame period. This is because the half latch circuit formed of the transistors Q5 to Q7 holds the nodes N1 and N1S at L level and the node N2 at H level. Accordingly, in the non-selected period of the gate line $GL_k$, the gate line driving signal $G_k$ and the shift signal $SH_k$ are both kept at L level with low impedance.

The unit shift register $SR_k$ described above can be summarized as follows. That is to say, the unit shift register $SR_k$ goes in a set state in response to the activation of the signal at the input terminal IN (input signal). In the set state, the transistors Q1 and Q1S are on and the transistors Q2 and Q2S are off. Accordingly, when the signal at the first clock terminal CK (the first clock signal) is activated, the gate driving signal $G_k$ goes to an active level, and when the signal at the second clock terminal CKS (the second clock signal) is activated, the shift signal $SH_k$ goes to an active level. Then, when the signal at the reset terminal RST (reset signal) is activated, it returns to the reset state, and after that the gate line driving signal $G_k$ and the shift signal $SH_k$ are kept at L level.

In a display effective period, the first clock signals CLK and /CLK are activated like the second clock signals CLKS and /CLKS, and so the unit shift register $SR_k$ in a set state (the transistors Q1 and Q1S are on and the transistors Q2 and Q2S are off) simultaneously activates the gate line driving signal $G_k$ and the shift signal $SH_k$.

On the other hand, in a display ineffective period, only the second clock signals CLKS and /CLKS are activated and the first clock signals CLK and /CLK are kept at L level. Accordingly, even when the unit shift register $SR_k$ enters a set state, the first output terminal OUT is not charged and the gate line driving signal $G_k$ does not change from L level. Accordingly, in a display ineffective period, the shift register $SR_k$ activates only the shift signal $SH_k$.

In the gate line driving circuit 30 of FIG. 2, a shift signal SH of the previous stage is inputted to the input terminal IN of each unit shift register SR, so that the shift operation of the shift signals SH is normally performed even when a period when the gate line driving signals G are not activated exists, and the shift signals are activated as $SH_1$, $SH_2$, $SH_3$, . . . Accordingly, when a partial display is made, the shift signals $SH_1$, $SH_2$, $SH_3$, . . . are all activated in this order, and the gate line driving signals $G_1$, $G_2$, $G_3$, . . . are activated only when they are in a display effective period (in selected periods of pixel lines requiring display).

Figure 4:
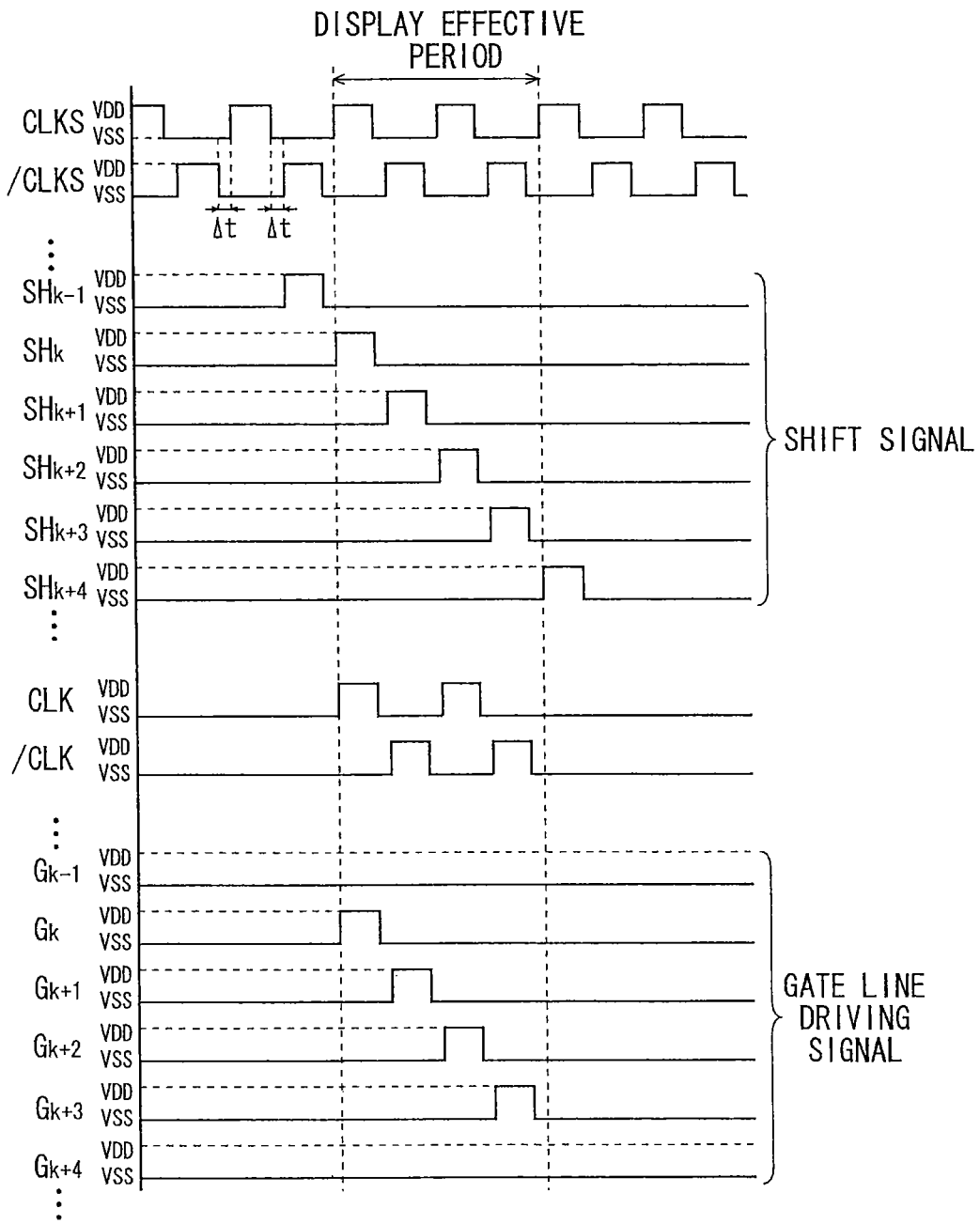
FIG. 4 is a timing chart illustrating the operation of the gate line driving circuit according to the preferred embodiment.

FIG. 4 is a signal waveform diagram illustrating the operation of the gate line driving circuit 30 of this preferred embodiment, and it shows an example in which a partial display is made where only the kth to (k+3)th pixel lines display.

As described above, the first clock signals CLK and /CLK are activated like the second clock signals CLKS and /CLKS only in display effective periods. For example, when the display is made only with the kth to (k+3)th pixel lines, as shown in FIG. 4, the first clock signals CLK and /CLK are activated in synchronization with the second clock signals CLKS and /CLKS from the beginning of the selected period of the kth line (the active period of the shift signal $SH_k$) to the end of the selected period of the (k+3)th line (the active period of the shift signal $SH_{k+3}$). Thus, the gate line driving signals $G_k$ to $G_{k+3}$ are activated in the selected periods of the gate lines $GL_k$ to $G_{k+3}$. The gate line driving signals G of the other lines are kept at an inactive level throughout the frame period.

Though not graphically shown, when an entire screen display is made, the first clock signals CLK and /CLK are always activated like the second clock signals CLKS and /CLKS. Accordingly, the gate line driving signals $G_1$, $G_2$, $G_3$, . . . are all sequentially activated with the same timing as the shift signals $SH_1$, $SH_2$, $SH_3$, . . .

Now, pay attention to the operation of the transistor Q8 in the unit shift register $SR_k$ in a display ineffective period. In a display ineffective period, the first clock terminal CK and the first output terminal OUT do not change from L level, and so the node N1 is not stepped up by the coupling through the gate capacitance of the transistor Q1 and the capacitance element C. Accordingly, when the potential of the node N1S is stepped up from VDD-Vth as the level of the second output terminal OUTS rises, the potential of the node N1 does not change from VDD-Vth.

That is to say, when the node N1S is stepped up, the source (node N1) potential of the transistor Q8 is VDD-Vth and the gate potential is VDD, and the gate-source voltage is Vth. In this state, only slight current, or sub-threshold current, flows in the transistor Q8, and the transistor Q8 is substantially off. That is to say, almost no current flows from the node N1S to the node N1, and the node N1S and the node N1 are substantially separated. Accordingly, the parasitic capacitance of the node N1S is small, and the node N1S is sufficiently stepped up as in a display effective period.

It is important that the high-side power-supply potential VDD1 supplied to the gate of the transistor Q8 be set not more than the potential of the active level of the shift signal $SH_{k-1}$ of the previous stage inputted to the input terminal IN (corresponding to the active level of the second clock signals CLKS, /CLKS). In this preferred embodiment, the high-side power-supply potential VDD1 and the potential of the active level of the shift signal $SH_{k-1}$ of the previous stage are assumed to be equal, and its value is defined as VDD. When the gate potential of the transistor Q8 is larger than VDD, the transistor Q8 does not turn off when the node N1S is stepped up in a display ineffective period, and the node N1S and the node N1 are not separated, and the above-described effect is not obtained.

On the other hand, when the gate potential of the transistor Q8 is lower than VDD, the potential of the node N1S after charged by the transistor Q8 is lower accordingly, which is not preferred, either. Accordingly, it is preferred that the gate potential of the transistor Q8 be higher in a range not exceeding VDD.

As describe so far, in the unit shift register $SR_k$ of this preferred embodiment, the transistor Q8 separates the nodes N1 and N1S when the node N1S is stepped up in response to activation of the shift signal $SH_k$. Accordingly, the node N1S is sufficiently stepped up and the rising rate of the shift signal $SH_k$ is sufficiently high. This effect is obtained both in display effective periods and display ineffective periods. That is to say, even in a display ineffective period, the rising rate of the shift signal SH is not lowered, and the reduction of operational margin of the gate line driving circuit 30 is prevented.

This preferred embodiment has shown an example in which the shift registers of the gate line driving circuit 30 are driven by using two-phase clock signals, but three- or more-phase clock signals can be used, of course.

(First Modification)

In the unit shift register $SR_k$ of FIG. 3, the drain of the transistor Q3 is connected to the second power-supply terminal S2 to which the given high-side power-supply potential VDD1 is supplied, but, as shown in FIG. 5, it may be connected to the input terminal IN to which the shift signal $SH_{k-1}$ of the previous stage is supplied. Then, the interconnection for supplying the high-side power-supply potential VDD1 to the transistor Q3 can be omitted and the circuit layout becomes easier.

In the configuration of FIG. 3, as compared with that of FIG. 5, the load capacitance that the shift signals SH of the unit shift registers SR drive is reduced, and the rising rate and falling rate of the shift signals SH of individual stages are enhanced.

(Second Modification)

In scanning line driving circuits of liquid-crystal display apparatuses and the like, transistors (a-Si transistors) formed of amorphous silicon (a-Si) are widely used. Such a-Si transistors have a property that the threshold voltage shifts when the gate is biased in a direct current manner, and it might cause malfunction of the scanning line driving circuit.

In the circuit of FIG. 3, for example, the gate of the transistor Q8 is always positively biased, so that the threshold voltage of the transistor Q8 shifts in the positive direction. In this case, the on-state resistance of the transistor Q8 becomes higher and the rates of charging/discharging of the node N1S might be lowered.

FIG. 6 is a circuit diagram of a unit shift register $SR_k$ according to a second modification of this preferred embodiment. In this unit shift register $SR_k$, as compared with the circuit of FIG. 5, the gate of the transistor Q8 is connected to the input terminal IN, and a transistor Q5S having its gate connected to the node N2 is connected between the node N1S and the first power-supply terminal S1. This modification is applicable also to the circuit of FIG. 3.

In the unit shift register SR of FIG. 6, the gate of the transistor Q8 is positively biased only in periods in which the node N1 goes to H level and the transistor Q8 charges the node N1S. That is to say, the gate of the transistor Q8 is not biased in a direct current manner, and the shift of the threshold voltage of the transistor Q8 is prevented.

However, unlike the circuits of FIG. 3 and FIG. 5, the transistor Q8 cannot discharge the node N1S, and so it requires the transistor Q5S that discharges the node N1S when the unit shift register SR is in a reset state (when the node N2 is at H level). Accordingly, it should be noted that it requires one more transistor as compared with FIGS. 3 and 5.

(Third Modification)

Figure 7:
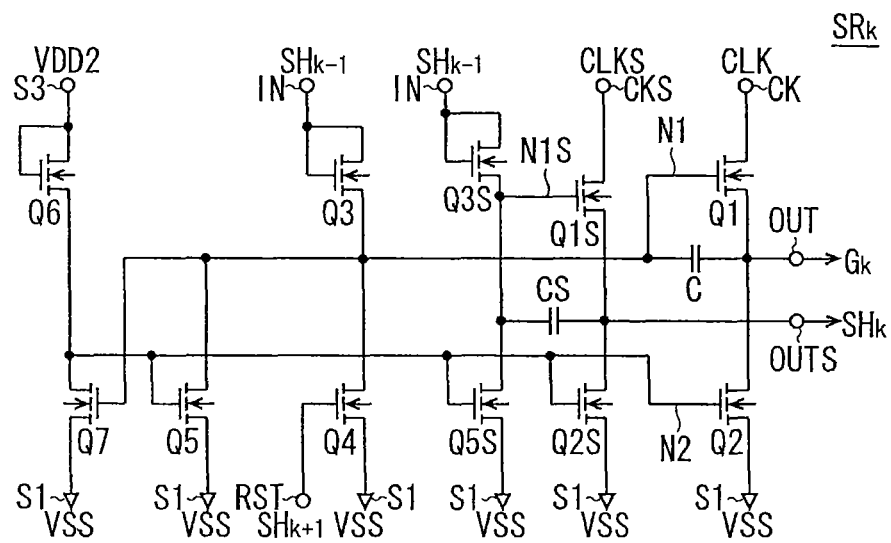
FIG. 7 is a circuit diagram of a unit shift register according to a third modification of the preferred embodiment.

FIG. 7 is a circuit diagram of a unit shift register $SR_k$ according to a third modification of the present invention. In place of the transistor Q8 of FIG. 5, this unit shift register $SR_k$ includes transistors Q3S and Q5S connected to the node N1S. The transistor Q3S is connected between the node N1S and the input terminal IN, and its gate is connected to the input terminal IN. The transistor Q5S is connected between the node N1S and the first power-supply terminal S1, and its gate is connected to the node N2.

This modification is applicable also to the circuit of FIG. 3. The drain of the transistor Q3S may be connected to the second power-supply terminal S2 or the third power-supply terminal S3.

In the shift register SR of FIG. 7, the transistor Q3S charges the node N1S in response to activation of the shift signal $SH_{k-1}$ of the previous stage, and the transistor Q5S discharges the node N1S when the node N2 goes to H level. That is to say, the two transistors Q3S and Q5S operate like the transistor Q8 in the circuits of FIG. 3 and FIG. 5.

According to this modification, the nodes N1 and N1S are completely separated, and so the gate capacitance of the transistor Q1 and the capacitance element C do not influence the step-up of the node N1S. Accordingly, even in a display ineffective period, the rising rate of the shift signal $SH_k$ is not lowered, and the reduction of operational margin of the gate line driving circuit 30 is prevented. However, it should be noted that it requires one more transistor as compared with FIGS. 3 and 5.

(Fourth Modification)

In this modification, the present invention is applied to a shift register that can change the shift direction of signals. A gate line driving circuit 30 formed of such a shift register is capable of scanning in both directions. The operation of shifting signals in the previous to following direction (the order of unit shift registers $SR_1, SR_2, SR_3, \ldots$) is defined as "forward shift", and the operation of shifting signals in the following to previous direction (the order of unit shift registers $SR_n$, $SR_{n-1}, SR_{n-2}, \ldots$) is defined as "backward shift".

Figure 8:
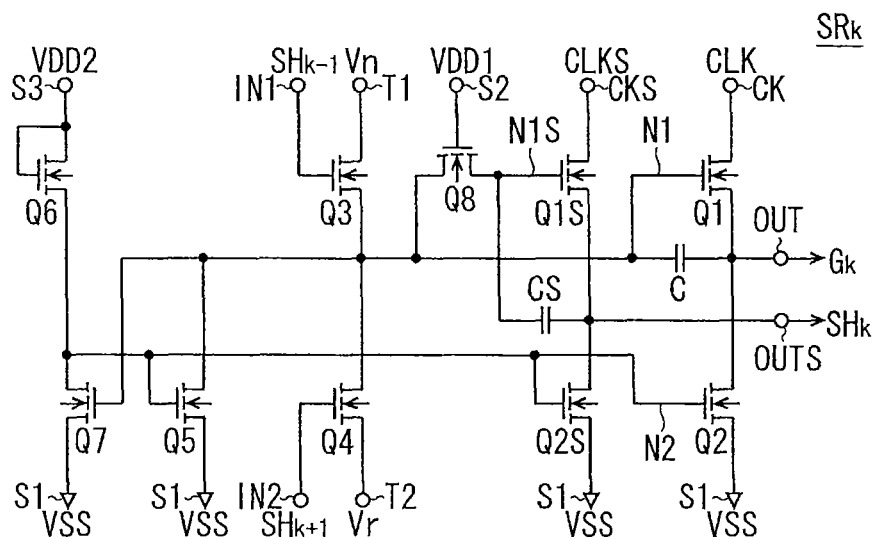
FIG. 8 is a circuit diagram of a unit shift register according to a fourth modification of the preferred embodiment.

FIG. 8 is a circuit diagram of a unit shift register $SR_k$ according to this modification. The unit shift register $SR_k$ is configured similarly to that of FIG. 3, except for the following respects.

That is to say, the unit shift register $SR_k$ has a first input terminal IN 1 receiving the shift signal $SH_{k-1}$ of the previous stage, a second input terminal IN2 receiving the shift signal $SH_{k+1}$ of the next stage, and first and second voltage signal terminals T1 and T2 supplied respectively with given first and second voltage signals Vn and Vr. The transistor Q3 is connected between the node N1 and the first voltage signal terminal T1, and its gate is connected to the first input terminal IN1. The transistor Q4 is connected between the node N1 and the second voltage signal terminal T2, and its gate is connected to the second input terminal IN2.

The first and second voltage signals Vn and Vr are control signals for determining the direction of shift of signals (scanning direction). When the unit shift register $SR_k$ performs forward shift, the first voltage signal Vn is set at H level and the second voltage signal Vr is set at L level. When it performs backward shift, the first voltage signal Vn is set at L level and the second voltage signal Vr is set at H level.

When the first voltage signal Vn is at H level and the second voltage signal Vr is at L level, the shift register $SR_k$ of FIG. 8 is equivalent to the circuit of FIG. 3, and forward shift is enabled. On the other hand, when the first voltage signal Vn is at L level and the second voltage signal Vr is at H level, the functions of the transistors Q3 and Q4 in the unit shift register $SR_k$ of FIG. 8 are opposite to those in the circuit of FIG. 3. That is to say, the transistor Q4 functions to charge the node N1 and the transistor Q3 functions to discharge the node N1. As a result, backward shift is enabled.

(Fifth Modification)

Figure 9:
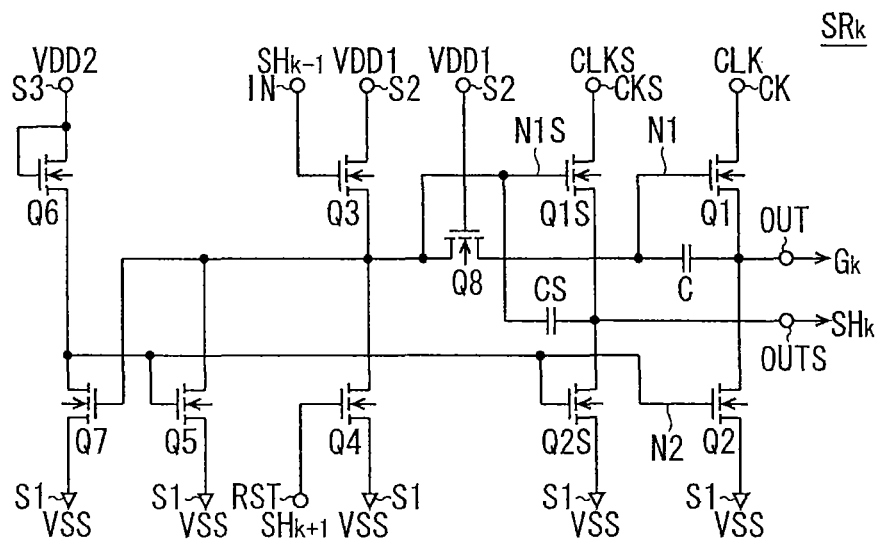
FIG. 9 is a circuit diagram of a unit shift register according to a fifth modification of the preferred embodiment.

In the circuit of FIG. 3, the source of the transistor Q3, the drains of the transistors Q4 and Q5, and the gate of the transistor Q7 are all connected to the node N1, but one or more of them may be connected to the node N1S. FIG. 9 shows an example in which all of them are connected to the node N1S.

When the source of the transistor Q3, the drains of the transistors Q4 and Q5, and the gate of the transistor Q7 are connected to the node N1S, the parasitic capacitance of the node N1 is reduced accordingly, and the node N1 is stepped up to higher potential, and the driving capability of the transistor Q1 is enhanced. Then, the rate of level transition of the gate line driving signal G is increased and the gate line GL can be driven at a higher rate.

On the other hand, the parasitic capacitance of the node N1S is increased, and so it should be noted that the rate of level transition of the shift signal SH is lowered. Whether the source of the transistor Q3, the drains of the transistors Q4 and Q5, and the gate of the transistor Q7 should be connected to the node N1 or N1S can be determined by considering characteristics of the display apparatus.

This modification is applicable also to the unit shift registers SR of the above-described modifications (FIGS. 5 to 8). However, the source of the transistor Q3 in FIG. 7 must be connected to the node N1. This is because, in the configuration of FIG. 7, the nodes N1 and N1S have to be charged with separate transistors.

Also, the drain of the transistor Q5 in FIG. 6 and FIG. 7 must be connected to the node N1. This is because the configurations of FIGS. 6 and 7 require separate transistors which bring the nodes N1 and N1S to L level with low impedance when the unit shift register SR is in a reset state.

Also, in the circuits of FIGS. 6 and 7, the drain of the transistor Q4 and the gate of the transistor Q7 must be connected to the same side. This is because, in the configurations of FIGS. 6 and 7, the nodes N1 and N1S are separated when the transistor Q4 turns on, and so the transistor Q7 cannot be turned off unless the drain of the transistor Q4 and the gate of the transistor Q7 are connected.

(Sixth Modification)

In this modification, the third modification (FIG. 7) is applied to a shift register capable of changing the shift direction of signals (fourth modification (FIG. 8)).

Figure 10:
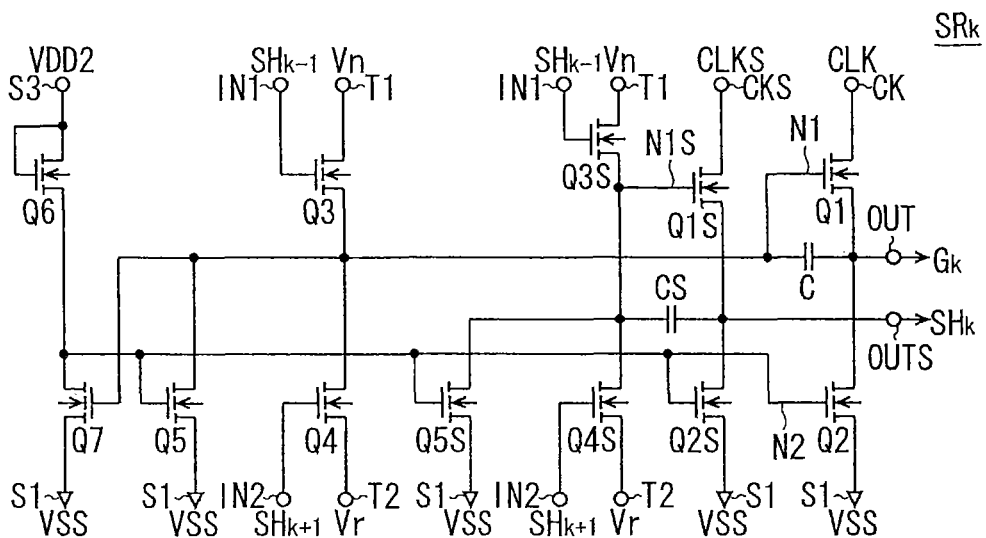
FIG. 10 is a circuit diagram of a unit shift register according to a sixth modification of the preferred embodiment.

FIG. 10 is a circuit diagram of a unit shift register $SR_k$ according to a sixth modification of this preferred embodiment. Like that of FIG. 8, this unit shift register $SR_k$ has a first input terminal IN1 receiving the shift signal $SH_{k-1}$ of the previous stage, a second input terminal IN2 receiving the shift signal $SH_{k+1}$ of the next stage, and first and second voltage signal terminals T1 and T2 supplied respectively with first and second voltage signals Vn and Vr.

The circuit configuration of this unit shift register $SR_k$ differs from that of FIG. 7 in the following respects. That is to say, the transistor Q3 is connected between the node N1 and the first voltage signal terminal T1, and its gate is connected to the first input terminal IN1. The transistor Q4 is connected between the node N1 and the second voltage signal terminal T2, and its gate is connected to the second input terminal IN2. The transistor Q3S is connected between the node N1S and the first voltage signal terminal T1, and its gate is connected to the first input terminal IN1. Also, it includes a transistor Q4S having its gate connected to the second input terminal IN2 and connected between the node N1S and the second voltage signal terminal T2.

When the first voltage signal Vn is at H level and the second voltage signal Vr is at L level, the unit shift register $SR_k$ of FIG. 10 is equivalent to the circuit of FIG. 7, and forward shift is enabled. However, while the node N1S is discharged by the transistor Q5S in FIG. 7, it is discharged mainly by the transistor Q4S in the circuit of FIG. 10 (the transistor Q5S mainly functions to keep the node N1S at L level with low impedance in a reset state).

On the other hand, when the first voltage signal Vn is at L level and the second voltage signal Vr is at H level, in the unit shift register $SR_k$ in FIG. 10, the functions of the transistors Q3, Q4, Q3S and Q4S are opposite to those in the case of forward shift. That is to say, the transistors Q4 and Q4S respectively function to charge the nodes N1 and N1S, and the transistors Q3 and Q3S respectively function to discharge the nodes N1 and N1S. As a result, backward shift is enabled.

In the circuit of FIG. 10, the gate of the transistor Q7 may be connected to the node N1S.

While the invention has been described in detail, the foregoing description is in all aspects illustrative and not restrictive. It is understood that numerous other modifications and variations can be devised without departing from the scope of the invention.

What is claimed is:

1. A shift register circuit comprising:
   first and second input terminals, first and second output terminals, and first and second clock terminals;
   first and second voltage signal terminals respectively supplied with first and second voltage signals that are complementary to each other;
   a first transistor that supplies said first output terminal with a first clock signal inputted to said first clock terminal;
   a second transistor that supplies said second output terminal with a second clock signal inputted to said second clock terminal;
   a third transistor that supplies said first voltage signal to a first node to which a control electrode of said first transistor connects or a second node to which a control electrode of said second transistor connects, in response to activation of a first input signal inputted to said first input terminal;
   a fourth transistor that supplies said second voltage signal to said first node or said second node in response to activation of a second input signal inputted to said second input terminal; and
   a fifth transistor connected between said first node and said second node, wherein
   said first clock signal and said second clock signal have a same phase, and a setting is possible such that only said second clock signal is activated and the first clock signal is kept at an inactive level in a particular period.

2. The shift register circuit according to claim 1, wherein a control electrode of said fifth transistor is connected to a power supply of a given potential that is not more than an active level of said second clock signal.

3. The shift register circuit according to claim 1, wherein, when said second output terminal is charged, said fifth transistor electrically separates said first node and second node.

4. The shift register circuit according to claim 1, further comprising:
- a sixth transistor that discharges said first output terminal; and
- a seventh transistor that discharges said second output terminal;
- wherein a control electrode of said sixth transistor and a control electrode of said seventh transistor are connected to each other.

* * * * *